United States Patent
Kim

(10) Patent No.: US 6,591,653 B2
(45) Date of Patent: Jul. 15, 2003

(54) PRODUCTION METHOD OF MULTI-GAUGE STRIPS

(76) Inventor: Choong-Yul Kim, Sangdo-dong, Dongjak-ku, Seoul, 156-831 (KR)

(*) Notice: Subject to any disclaimer, the term of this patent is extended or adjusted under 35 U.S.C. 154(b) by 0 days.

(21) Appl. No.: 09/914,896

(22) PCT Filed: Jan. 3, 2001

(86) PCT No.: PCT/KR01/00010

§ 371 (c)(1), (2), (4) Date: Sep. 4, 2001

(87) PCT Pub. No.: WO01/49431

PCT Pub. Date: Jul. 12, 2001

(65) Prior Publication Data

US 2002/0166358 A1 Nov. 14, 2002

(30) Foreign Application Priority Data

Jan. 5, 2000 (KR) .................... 2000-000378

(51) Int. Cl.[7] ............................... B21D 5/08
(52) U.S. Cl. .............................. 72/177; 72/377
(58) Field of Search ................. 72/177, 176, 377

(56) References Cited

U.S. PATENT DOCUMENTS 1,177,320 A * 3/1916 Grabowski ............ 72/377
3,209,432 A * 10/1965 Cape ..................... 72/177
4,578,979 A * 4/1986 Abe et al. ............... 72/177
5,890,389 A * 4/1999 Ohba et al. ............. 72/234

FOREIGN PATENT DOCUMENTS

JP 1-299701 * 12/1989 .................. 72/377

* cited by examiner

Primary Examiner—Daniel C. Crane

(57) ABSTRACT

Multi-gauge strips are mainly used as materials for terminals of lead frames, relays, connectors, etc. of power transistors. The objective of the present invention is to provide a method of producing multi gauge strips by means of forming copper, a copper alloy, or a metal strip which can undergo plastic work in such a manner that its two sides in the widthwise direction are thinner than the center portion. In order to achieve the objective therein, the present invention provides a method producing multi gauge strips, which comprises the following steps of forming a flat strip into semi circular and "U" shape into a flat sheet so that the center portion of the strip in the widthwise direction is thicker, and the two sides from the center are made comparatively thinner. In this manner, the present invention enables stretch forming with an ordinary press in the widthwise direction of a material, which is a rather difficult process even with high priced special purpose equipment of the prior art. Consequently, the present invention provides, among others, economical efficiency by way of using inexpensive general purpose equipment; reduction in production cost due to its easy workability; and enhancement of productivity; and efficiently coping with the small for production of a variety of types.

1 Claim, 5 Drawing Sheets

PRODUCTION METHOD OF MULTI-GAUGE STRIPS

TECHNICAL FIELD

Multi-gauge strips are mainly used as materials for terminals of lead frames, relays, connectors, etc. of power trasistors. The present invention relates to a method of producing a multi-gauge strips by means of forming copper, a copper alloy, or a metal strip which can undergo plastic work in such a manner that its two sides in the widthwise direction are thinner than the center portion.

BACKGROUND ART

As for the conventional methods of producing a multi-gauge strips, the following methods are generally known: a scalping method of thinly cutting the surfaces of the two sides of a strip to reduce the thickness thereof while leaving its center portion intact by means of using a cutting tool; a welding method of joining thin materials to the two sides from the center of a strip; a seesaw method (hereinafter SS) of rolling at a right angle to the direction of progression of a material in feed; and a rectilinear rolling method (hereinafter RL) of rolling in the direction of progression of a material in feed. The items of specification requirements for a multi-gauge strips are as follows: shape, thickness, precision, surface roughness, straightness, hardness, etc. In this regard, with the scalping method, among other methods aforementioned, the quality of the material at the thick portion and that of the thin portion are the same as a result of scalping the surfaces of the two sides of the same material, and thus the method is able to satisfy the hardness requirement among others, but it nonetheless leads to difficulties in satisfying other specification requirements. Moreover, in conjunction with the losses associated with the cut portions, the size of the material is set to be larger than that of the finished product, and these factors lead to a disadvantage of lowering the utility ratio of a material.

With respect to the welding method, as well, even if the welding can be achieved in an instant, a source of heat of high temperature is required for such welding. To void interposition of oxides at the welding area on account of such welding, it needs a non-oxide atmosphere in a nearly vacuum condition, and to maintain such a non-oxide atmosphere, it necessarily incurs high installment and operation costs, which in turn leads to a high production cost. Moreover, with respect to the welding area, the quality reliability is lowered, which in than tends to limit the utility of a strip.

As for another method in addition to those aforementioned, there is a seesaw method (SS) or a V-MILL method, wherein pressure is put onto a strip material (M) which in turn is placed on a metal mold (TL), as shown in FIG. 1, with a direction of rolling in a back-and-forth motion, or by a method of working from left to right, much like a seesaw, at a right angle (RA) to the material (M). In this manner, the center portion of the strip material (M) is indented by the lower surface (S) of the mold, and the two sides thereof in the width direction are stretched out to the respective space (S) at either side, thereby forming a thick portion (TK) and a thin portion (TN) therein. In this method, pressure is effectuated vertically on the material, which in turn is placed on the flat metal mold. As such, the stretching work on the material is made difficult due to a sticking caused by friction between the mold and the material. As compare to drawing works, it requires pressure of several tens of times, which in turn necessitates equipment of large capacity in addition to the high-strength metal molds. Moreover, since the operation of a rolling roll or a metal mold must be carried out in the direction which is left and right to the direction of progression of the material, there is an ensuing problem of requiring high-priced special-purpose equipment of large capacity, instead of ordinary general-purpose equipment. Further, since the ends of the two sides of a material in the width direction must be maintained at a slant while stretching the same for continuous formation, it limits the feed speed to the level of 1~2 m/minute, which in turn dramatically lowers productivity.

Further, as another method in addition to those aforementioned, the rectilinear rolling method (RL) involves passing the material (M) between the two rolling rolls (R), one on the top and the other on the bottom, each having a rectilinear indentation and a protrusion. In this manner, by folding the two sides of the material in the widthwise direction (WO), the primary rolling (RL1) is carried out into the shape having a protrusion at the center portion (V1) thereof Then, in the secondary rolling (RL2), by compressing the upper end of the center portion (V1), the widths (L1, V1, W1) and the thickness (T1, t1) formed during the primary rolling (RL1) are formed into the following widths (L2, V2, W2) and thicknesses (T2, t2). Receiving the material therefrom, the tertiary rolling (RL3) using the same method of the primary rolling (RL1) carries out the process of rolling it into the shape with the following widths (L3, V3, W3) and the thicknesses (T3, t3). By repetitively carrying out the aforementioned process, the material is formed into the following specifications of widths (L, V, W) and thicknesses (T, t).

Here, the width of the center portion is reduced from V1 to V2 and then to V3, and the width of the either side is widened from L1 to L2 and then to L3. The total width thereof is enlarged from W1 to W2 and then to W3, and the thickness at the center is reduced from T1 to T1 and then to T3. The thickness of the either side from the center portion (V1) is also reduced from t1, to t2 and then to t3. In this manner, a multi-gauge strips is formed thereby, the art of which is generally known in the field.

However, in the aforementioned rectilinear rolling method, due to the peculiarity of the rolling work, the direction of staining (stretching) of the material is such that the staining of the material is achieved only in the lengthwise direction of the material, which is the direction of progression of rolling. The straining of the material in the width direction, which is perpendicular to the direction of progression of the material, or the elongation as a result of stretching, is insignificant as compared to that in the direction of progression of the material. As such, by compressing the lower side of said center portion (V1) in the width direction, the ends of the two sides are widened while the thickness (t1) of the either side is reduced to the thickness (t2) by means of rolling work. As such, 8 to 10 units of rolling mills must be arranged continuously therein since the above process of widening by stretching the two sides (L2) in the widthwise direction must be carried out repetitively for about ten times or so. Hence, in terms of facility investment, there is indeed a problem of economical efficiency.

Moreover, as for the tandem rolling method having a continuous placement of rolling rolls in a serial manner, the continuous rolling is carried out in such a manner that a strip with a given length after undergone the rolling process in the preceding roll (R) is received by the subsequent roll (R), which in turn is received by the next subsequent roll (R).

With respect to the length of the material, stretched at that time, the length of the strip is elongated in the order of primary, secondary and tertiary rollings. As such, with the same rotation speed with resect to the primary, secondary and tertiary rolling rolls, the continuous work cannot possibly be carried out therein. To solve this problem, equipment with a special function to control the rotation speed of the rolls (R) is required, which is rather problematic in itself.

Moreover, the rolls (R), which are used in the rolling process are tools with specifications of multi-gauge strips materials (P), and the rolls (R) of various specifications in small lots must be provided beforehand, which leads to a problem of rising cost with the inconvenience of operational management in disassembling and changing the rolls (R) at the time of working with a respective specification.

DISCLOSURE OF INVENTION

In order to solve the aforementioned problems of the prior art, the present invention presents a method producing a multi-gauge strips, which comprises as follows: forming a flat strip into a semi-circular shape in the widthwise direction by using an ordinary general-purpose press; reducing the thickness of the two sides of the semi-circular shape thereof, forming into a "U" shape by stretching in length the ends of the two sides of the semi-circular shape thereof with a reduced thickness, and then forming a protrusion of a curved surface along the inner circumference of the "U" shape thereof, and forming the "U" shape therein with a protrusion of a curved surface along the inner circumference thereof into a flat multi-gauge strips, wherein said protrusion of a curved surface along the inner circumference is continuously formed into a thick portion at the center of said flat multi-gauge strips, and the two sides of the "U" shape thereof into thin portions at either side of said flat multi-gauge strips.

In order to achieve the technical objective therein, the present invention provides a method of producing a multi-gauge strips, in relation to a method of producing a multi-gauge strips, which includes the steps of forming a flat strip material into semi-circular and "U" shapes by means of press work while sequentially feeding said strip material between an upper mold and a lower mold, wherein said method comprises the steps of: (a) forming a flat strip material into a semi-circular shape in the widthwise direction; (b) gradually forming the semi-circular shape thereof as formed above into a "U" shape, in which the ends of the two sides thereof are connected by a slanted side, and at the same time press-forming a protrusion of a curved surface, slanted gradually, on the inner circumference of the semi-circular and "U" shapes thereof, (c) forming said slanted side into a straight line to form the material into the "U" shape while forming the slanted protrusion of a curved surface into a protrusion of a curved surface having the same amount of protrusion; (d) forming the material into a strip with curvature by forming said protrusion of a curved surface into a flat protrusion; (e) forming the material into a flat multi-gauge strips by flat-pressing the two sides and the flat protrusion of said strip with curvature, wherein the protrusion and the two sides thereof are set to in parallel thereby; and (f) causing the ends of the two sides of said flat multi-gauge strips.

BEST MODE FOR CARRYING OUT THE INVENTION

Figure 1:
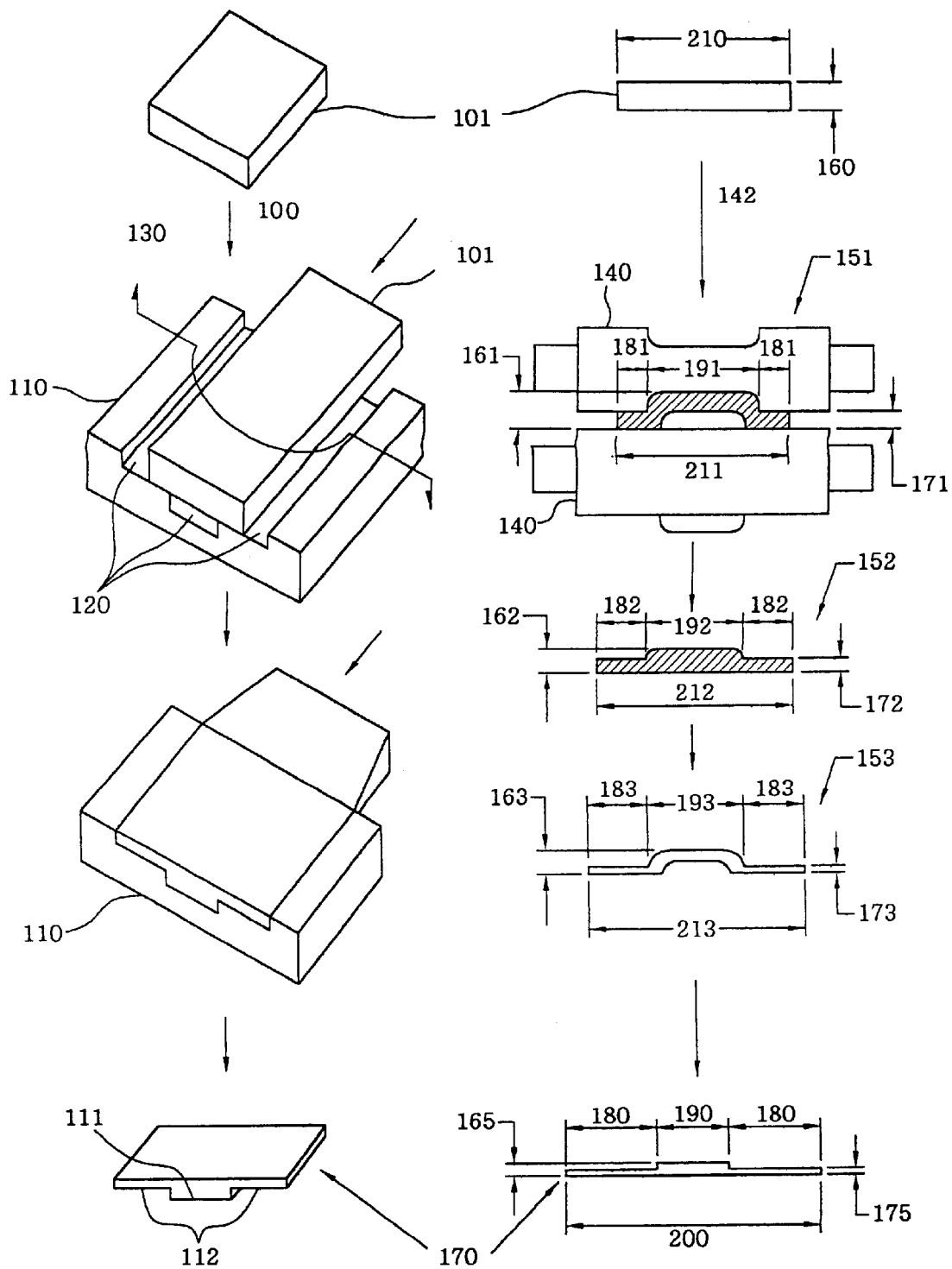
FIG. 1 is a process drawing outline of a conventional method of producing a multi-gauge strips.
Figure 2:
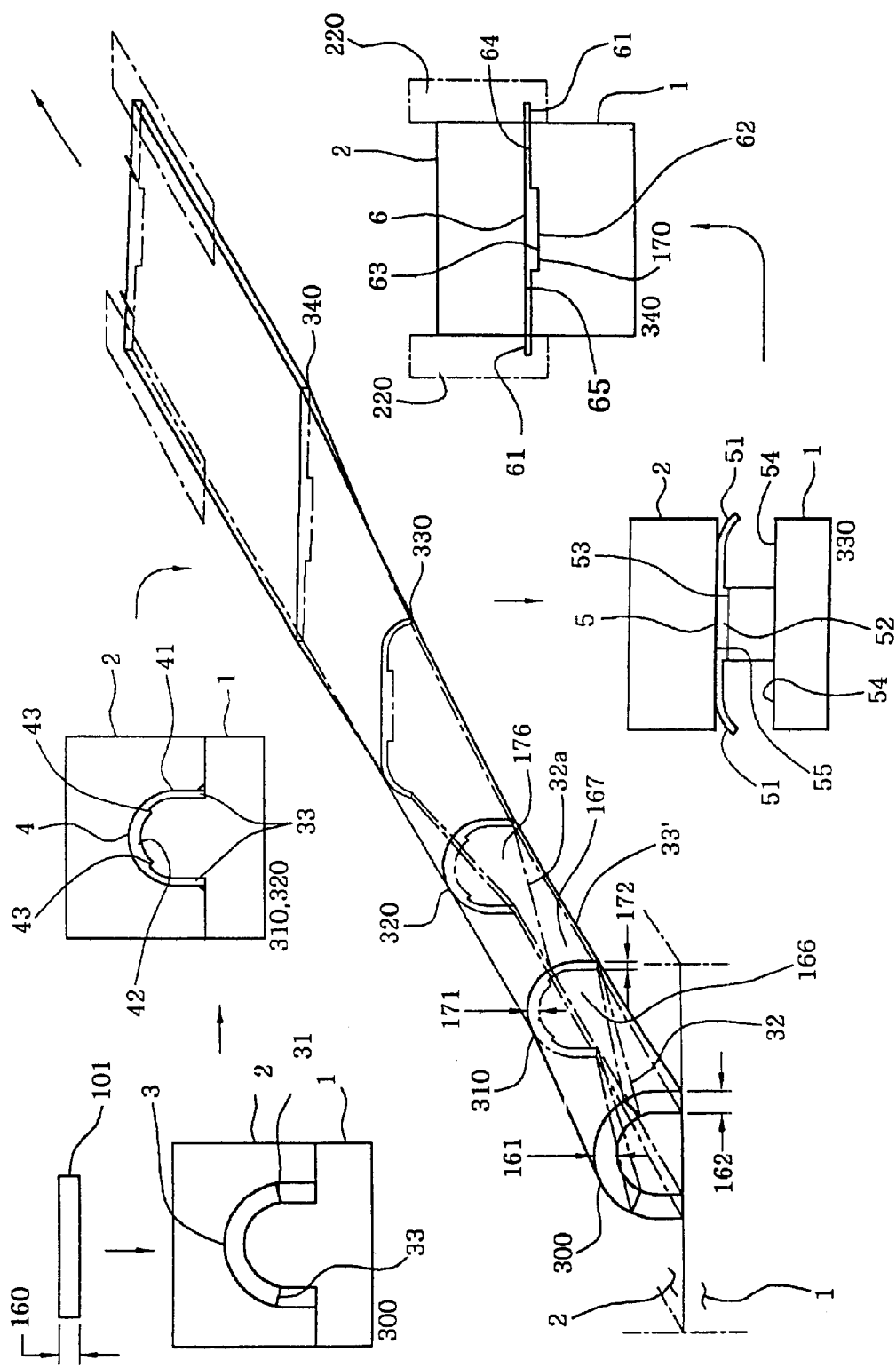
FIG. 2 is a process drawing, which illustrates an embodiment according to the method of the present invention.
Figure 2A:
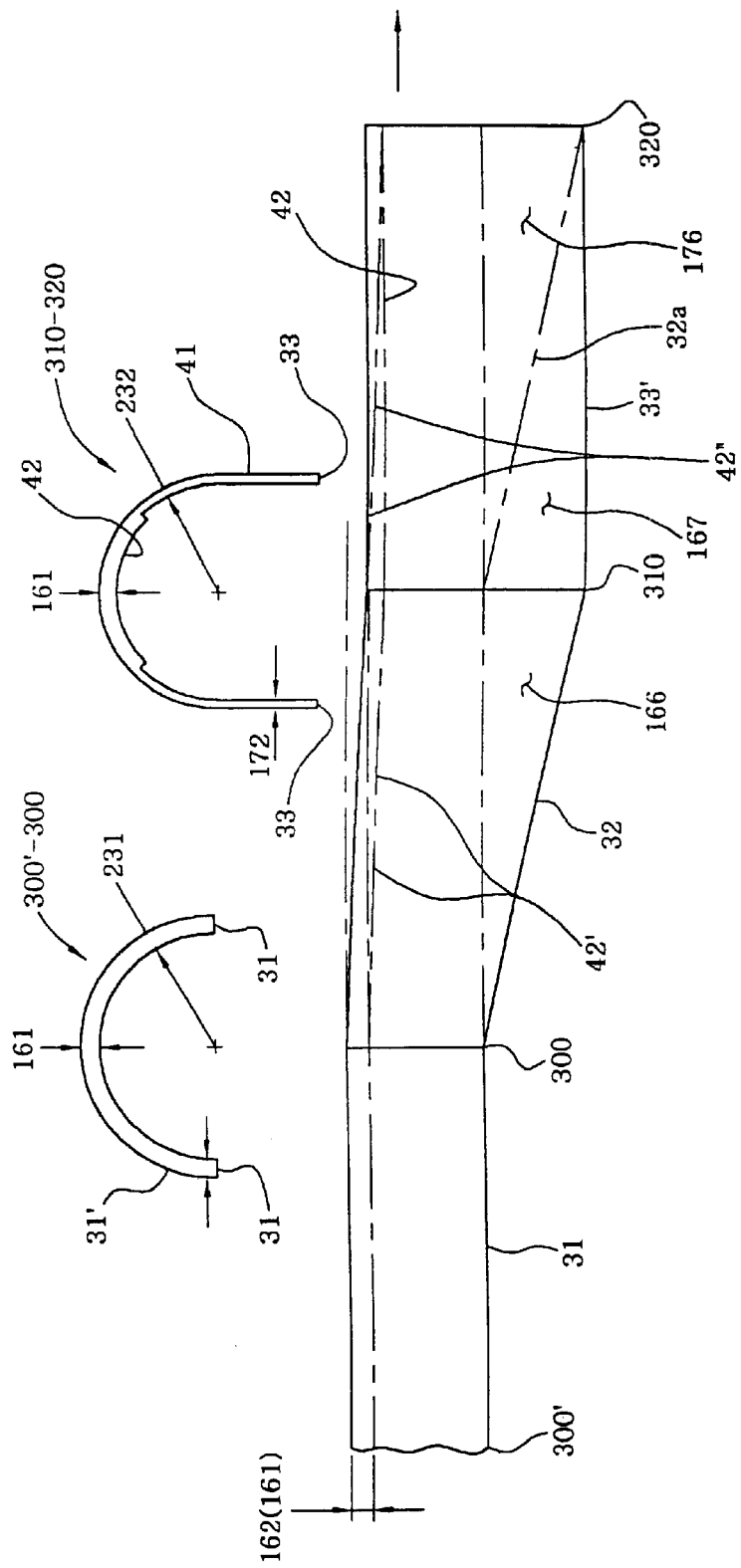
FIG. 2a is a lateral-sectional drawing, which illustrates an embodiment according to the method of the present invention.
Figure 2B:
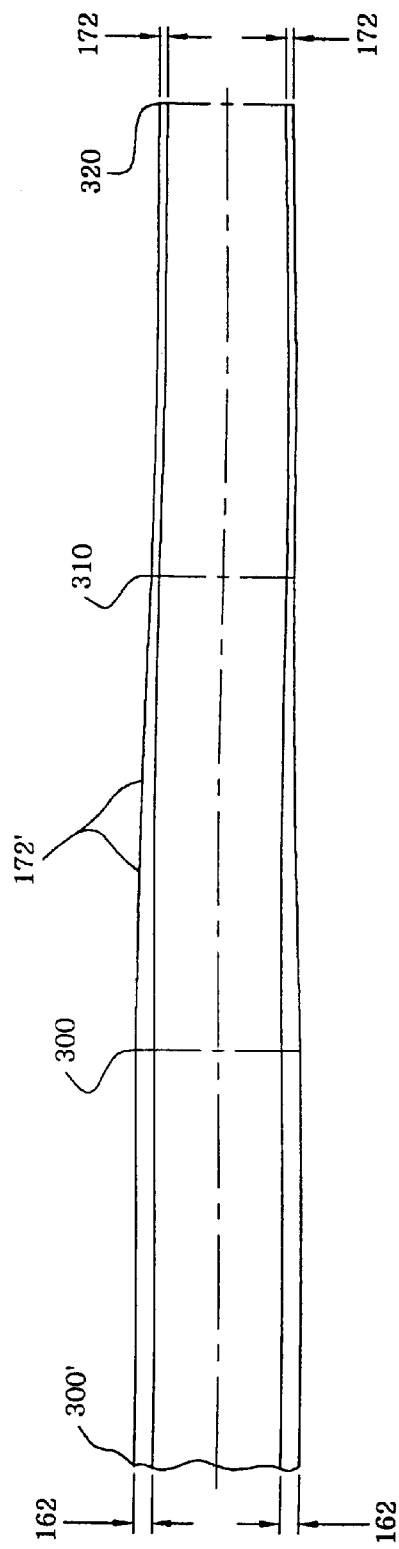
FIG. 2b is a flat sectional drawing, which illustrates an embodiment according to the method of the present invention.

A preferable embodiment of the present invention as constructed above is described in detail with references to the drawings as illustrated: FIGS. 2, 2a and 2b are process drawings on a step-by-step basis, which illustrate the process of producing a multi-gauge strips according to an embodiment of the present invention. The letters (e.g., a, b, c, d, e) therein point to the cross-sections thereof during the formations on a step-by-step basis.

A flat strip material in coil is press-formed into a semi-circular shape between the upper mold 2 and the lower mold 1 at section a~a. Then, by placing the semi-circular shape 3 thereof at position (b) in section a~b and lowering the upper mold 2 thereto, the flat strip material (M) in the widthwise direction maintains the semi-circular shape 3 at position (a) while forming into the "U" shape 4 at position (b). The ends 31 of the semi-circular shape 3 and the ends 33 of the "U" shape 4 thereof are at a slant 32 from position (a) to (b). Ate same time, a protrusion of a curbed surface 42' with a gradual slant from position (a) to (b) on the inner circumference of the semi circular shape 3 to the "U" shape 4 is formed thereon During the above process the diameters (r1) of the inner circumference of the upper mold 2 are the same at section a~a. From position (a) to (b), the diameters (r2) therein become gradually smaller. At section a~a, the strip material is formed into the semi-circular shape 3. In section a~b, the thickness (T2) of the two sides 31' of the semi-circular shape 3 gradually becomes thinner during formation into the thickness (t2) of the two sides 41 of the "U" shape 4 thereof. In this manner, the portion with thickness (t2') at a slant becomes longer and forms a slant 32 at the ends of the semi-circular shape 3 thereof, which in turn are connected to the ends 33 of the "U" shape 4. At the same time, with respect to the groove 43 for a protrusion of a curved surface, formed at the upper end of the outer circumference of the lower mold 1, the definition of intermesh of the material (M) is gradually increased from position (a) to (b), and as such, the protrusion of a curved surface 42' at a slant toward position (b) is formed thereon.

At the upper ends of the slanted side 32, which connects the ends 31 of the semi-circular shape 3 to the ends 33 of the "U" shape as formed above, the portion which has been reduced in thickness (t2') from the two sides thereof at section a~b is stretched lengthwise, and a wider area (ΔT) is formed at the upper end of the slanted side 32 thereby. Then, it is fed into section b~c. Consequently, the "U" shape 4 thereof formed at section a~b is positioned at position (c), and the semicircular shape 3 thereof is positioned at position (b). There, the upper portion of the slanted side 32a has an area (Δt) widened at section a~b, and the lower portion of the slanted side 32a has a non-formed portion (□T). The semi-circular shape 3 of a strip material, newly fed thereto, is positioned at section a~b.

In this state, the upper mold 2 is lowered therein to form a semi-circular shape 3 at section a'~a and section a~b by means of the same method used as above. The ends 31 of the two sides 31' of the semi-circular shape 3, and the ends 33 of the two sides 41 of the "U" shape 4 thereof as formed are connected at a slant. At section b~c, the non-formed portion (□T) at the lower end of the slanted side 32a, which had not been formed in section a~b, is elongated to be formed into the "U" shape 4, wherein the ends 31 of the semi-circular shape 3 are at a straight line 33' to the ends 33 of the "U" shape 4. The protrusion of a curved surface 42" slanted from position (b) to (c) on the inner circumference therein is formed into a protrusion 42 of a curved surface having the same amount of protrusion.

In other words, the "U" shape 4 after undergoing the aforementioned formation process has the same amount of protrusion with respect to the protrusion 42 of a curved surface. Moreover, the thicknesses (t2) of the two sides are equal, and the lengths of the two sides are equal as well. As such, it is formed into the same shape of a multi-gauge ships folded into a "U" shape.

The "U" shape 4 thereof after undergoing the aforementioned formation process is fed to section c~d wherein the lower surface 55 of the upper mold 2, and the upper surface 53 of the lower mold 55' are of a flat surface. By means of pressure of a press, the protrusion 42 of a curved surface is straightened into a flat protrusion 52 while at the same time the two sides 41 of the "U" shape 4 are straightened out slightly in the widthwise direction to form a strip 5 with curvature having curvature on either side.

At that time, to avoid interference by way of a gradual spreading of the two sides 41 of the "U" shape 4 thereof, the two sides thereof at the upper mold 2 are cut in order to secure space. The two sides 54 of the lower mold 1 are connected to the two sides 64 thereof at position (e) via an upward slant (not illustrated), which in turn facilitates the entry of the material from position (d) to (e).

The strip 5 with curvature fed to the next section of d~e is then fed through the space between the upper mold 2 and the lower mold 1, having a shape of a multi-gauge strips material, wherein the lower surface 65 of the upper mold 2, the two sides 64 of the lower mold 1, and the surface 63 of the indentation for a flat protrusion are all in parallel. In this manner, by means of flattening pressure of a press, a flat multi-gauge strips 6 is formed thereby, wherein the surface of a protrusion 62, and the two sides 61 therefor in parallel.

Next the ends of the two sides 61 of the flat multi-gauge strips 6 are cut (SH) by the process of lowering a punch, attached either side of the upper mold 2. In this manner, he process of formation thereof is duly completed. Nonetheless, the aforementioned cutting process may be omitted in cases of carrying out post-manufacturing processes of annealing and rolling.

During the process of drawing a flat strip material (M) into a "U" shape at section a~c of the metal mold, as shown above, the direction of pressure of a press is perpendicular to the direction of progression of the material. Hence, even with little pressure therein, a great deal of straining on the material can be achieved, and the work, which is rather difficult with a conventional rolling process, can be completed with ease. The stretching and flat-press forming at section d~e correspond to stretching process, and there is no straining on the material after said processing. In particular since the structural shapes of the upper mold 2 and the lower mold 1 at section (e) are of the same shape as those of the multi-gauge strips material (P) according to a given specification requirement, high precision with stable material quality can be achieved by the method therein.

Figure 3:
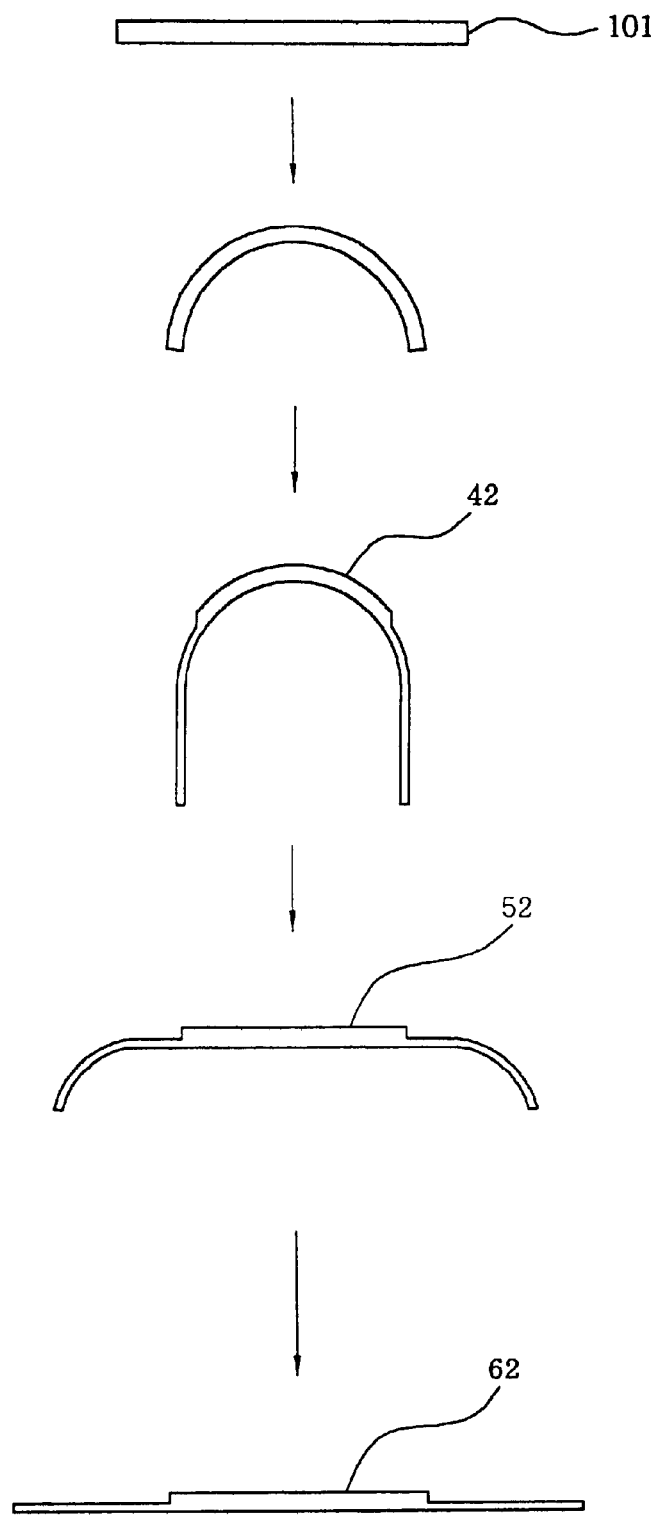
FIG. 3 is a process drawing, which illustrates another embodiment according to the method of the present invention.

Another embodiment as shown in FIG. 3 embodies the same method as described above, except for the fact that the protrusion (42, 52, 62) is formed outside, which is at the upper end of the outer circumference of the "U" shape 4 thereof.

The present invention is not limited to the single-row process and can be carried out with a multiple of rows within given capacity of a press. As for the method of cutting (SH) by a punch, the method of cutting the ends by a rotational cutter can be alternatively applied therein. Moreover, the present invention can also be carried out with a change in the structure of the upper mold 2 and the lower mold 1 from the reverse "U" shape to the "U" shape.

According to the method of the present invention as described above, it enables application of ordinary press equipment to the processing of a strip material in the widthwise direction, which is a rather difficult process by a conventional seesaw or rectilinear rolling process. Consequently, the present invention provides many advantages as follows: economical efficiency by way of using inexpensive general-purpose equipment; reduction of production cost due to its easy workability and enhancement of productivity; not being limited to the types of materials due to an ease in enlarging the amount of stain on the material; efficiently coping with the small-lot production of various types by way of production with metal molds of a simple structure; and significant reduction in cost of tools used in production.

What is claimed is:

1. A method of producing a multi-gauge strip using cooperating molds, comprising the steps of:

(a) providing a flat strip material having a thickness and including two sides each having an end, a widthwise direction extending between the two sides of the flat strip material and a lengthwise direction extending perpendicular to the widthwise direction;

(b) forming the strip material into a semi-circular shape in the widthwise direction in the course of movement of the strip in a direction of progression;

(c) forming the semi-circular shape of the strip material into a U-shape by elongating the two sides of the semi-circular shape thus making said two sides gradually longer along the lengthwise direction toward the direction of progression of said strip material and forming each leg of the U-shape with a straight end, the thickness of said two sides gradually decreasing along the lengthwise direction toward the direction of progression of said strip material, and simultaneously forming a curved protrusion along the inner circumference of the U-shape in between the legs of the U-shape, the thickness of the curved protrusion gradually decreasing along the lengthwise direction toward the direction of progression of said strip material;

(d) forming the strip material, extending from the U-shape of the strip material, so as to equalize the legs of the U-shape to a constant height in which the thickness of the legs of the U-shape and the thickness of said curved protrusion, respectively, are evened out to uniformity in the lengthwise direction toward the direction of progression of said strip material;

(e) forming the curved protrusion of the U-shape into a flat protrusion and at least a portion of each leg of the U-shape with a curve; and (f) flattening the curved portion of each leg of the U-shape so that the surface of each leg is substantially parallel to the surface of the flat protrusion but is located in a different plane.

* * * * *